(12) United States Patent
Yokota (10) Patent No.: US 12,020,898 B2
(45) Date of Patent: Jun. 25, 2024

(54) PLASMA PROCESSING SYSTEM AND METHOD OF PROCESSING SUBSTRATE

(71) Applicant: Tokyo Electron Limited, Tokyo (JP)

(72) Inventor: Akihiro Yokota, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 271 days.

(21) Appl. No.: 17/004,260

(22) Filed: Aug. 27, 2020

(65) Prior Publication Data

US 2021/0074511 A1   Mar. 11, 2021

(30) Foreign Application Priority Data

Sep. 9, 2019 (JP) .................................. 2019-163794
Jun. 2, 2020 (JP) .................................. 2020-096205

(51) Int. Cl.
  *H01J 37/32* (2006.01)
(52) U.S. Cl.
  CPC ........ *H01J 37/321* (2013.01); *H01J 37/3244* (2013.01); *H01J 37/32669* (2013.01)
(58) Field of Classification Search
  CPC ........ H01J 1/50; H01J 37/321; H01J 37/3244; H01J 37/3266–32688; H01J 2237/334
  See application file for complete search history.

(56) References Cited

U.S. PATENT DOCUMENTS

| | | | | |
|---|---|---|---|---|
| 4,842,707 A | * | 6/1989 | Kinoshita | ........... H01J 37/3405 156/345.46 |
| 4,963,242 A | * | 10/1990 | Sato | .................... H01J 37/3266 156/345.46 |
| 2002/0142615 A1 | * | 10/2002 | Kanno | ................ H01J 37/3266 156/345.46 |
| 2013/0264194 A1 | * | 10/2013 | Xu | .......................... C23C 16/27 204/192.38 |
| 2015/0072534 A1 | * | 3/2015 | Himori | ............. H01L 21/31116 438/725 |
| 2015/0332898 A1 | * | 11/2015 | Yokota | .................... C23C 16/50 118/723 R |
| 2017/0004956 A1 | * | 1/2017 | Yasuda | ............. H01J 37/32082 |

(Continued)

FOREIGN PATENT DOCUMENTS

| | | |
|---|---|---|
| JP | S62-229945 A | 10/1987 |
| JP | H4-324631 A | 11/1992 |
| JP | H6-177079 A | 6/1994 |

(Continued)

*Primary Examiner* — Benjamin Kendall
(74) *Attorney, Agent, or Firm* — Studebaker & Brackett PC (57) ABSTRACT

One disclosed plasma processing system includes a chamber, a substrate support, a plasma generator, and first and second electric magnet assemblies. The substrate support is disposed in the chamber. A center of a substrate on the substrate support is positioned on a central axis of the chamber. The plasma generator is configured to generate a plasma in the chamber. The first electric magnet assembly includes one or more first annular coils and is disposed on or above the chamber and configured to generate a first magnetic field in the chamber. The second electric magnet assembly includes one or more second annular coils and is configured to generate a second magnetic field in the chamber. The second magnetic field reduces the intensity of the first magnetic field in the center of the substrate on the substrate support.

5 Claims, 5 Drawing Sheets (56) References Cited

U.S. PATENT DOCUMENTS

2017/0018407 A1* 1/2017 Kondo .............. H01L 21/67069
2017/0103877 A1* 4/2017 Yokota .............. H01L 21/31116

FOREIGN PATENT DOCUMENTS

| JP | H8-311668 A | 11/1996 |
| JP | 2003-218093 A | 7/2003 |
| JP | 2017-073518 A | 4/2017 |

* cited by examiner

PLASMA PROCESSING SYSTEM AND METHOD OF PROCESSING SUBSTRATE

CROSS-REFERENCE TO RELATED APPLICATIONS

This application is based on and claims the benefit of priority from Japanese Patent Application Nos. 2019-163794 filed on Sep. 9, 2019 and 2020-096205 filed on Jun. 2, 2020, the entire contents of which are incorporated herein by reference.

FIELD

Exemplary embodiments of the present disclosure relate to a plasma processing system and a method of processing a substrate.

BACKGROUND

In the manufacture of electronic devices, plasma processing is performed on a substrate. Plasma processing requires uniformity in a radial direction of the substrate. In order to improve the uniformity of plasma processing in the radial direction of the substrate, a plasma processing apparatus including an electric magnet may be used. Japanese Patent Application Laid-Open Publication No. 2017-73518 discloses a plasma processing apparatus including an electric magnet. The electric magnet is provided above a chamber. The electric magnet has a coil wound around a central axis of the chamber. The central axis of the electric magnet extends in a vertical direction. The substrate is disposed on a substrate support so that a center of the substrate is positioned on the central axis.

Incidentally, as one type of plasma processing, plasma etching of a silicon film of a substrate is known. The silicon film is etched by chemical species from plasma generated from hydrogen bromide gas and/or chlorine gas. Such plasma processing is disclosed in Japanese Patent Publication Laid-Open Publication No. 2003-218093.

SUMMARY

In an exemplary embodiment, a plasma processing system is provided. The plasma processing system includes a chamber, a substrate support, a plasma generator, a first electric magnet assembly, and a second electric magnet assembly. The chamber has a central axis. The substrate support is disposed in the chamber. A center of a substrate on the substrate support is positioned on the central axis. The plasma generator is configured to generate a plasma from a process gas supplied into the chamber. The first electric magnet assembly includes one or more first annular coils and is disposed on or above the chamber and configured to generate a first magnetic field in the chamber. The second electric magnet assembly includes one or more second annular coils and is configured to generate a second magnetic field in the chamber. The second magnetic field reduces intensity of the first magnetic field in the center of the substrate on the substrate support.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, a plasma processing system is provided. The plasma processing system includes a chamber, a substrate support, a plasma generator, a first electric magnet assembly, and a second electric magnet assembly. The chamber has a central axis. The substrate support is disposed in the chamber. A center of a substrate on the substrate support is positioned on the central axis. The plasma generator is configured to generate a plasma from a process gas supplied into the chamber. The first electric magnet assembly includes one or more first annular coils and is disposed on or above the chamber and configured to generate a first magnetic field in the chamber. The second electric magnet assembly includes one or more second annular coils and is configured to generate a second magnetic field in the chamber. The second magnetic field reduces intensity of the first magnetic field in the center of the substrate on the substrate support.

The density of negative ions in plasma generated in a chamber tends to be high on or near a central axis of the chamber. When a magnetic field is generated in the chamber by a first electric magnet assembly in a state where such plasma is generated, the processing speed of a substrate is locally increased at the center of the substrate. In a plasma processing system according to an exemplary embodiment, the intensity of a magnetic field generated by a first electric magnet assembly is reduced by a magnetic field generated by a second electric magnet assembly at a location where the substrate disposed on the substrate support intersects the central axis of the chamber. As a result, the processing speed of the substrate is suppressed from locally increasing at the central portion thereof.

In an exemplary embodiment, the second electric magnet assembly may be disposed below the substrate support.

In an exemplary embodiment, the second electric magnet assembly may be disposed on or above the chamber.

In an exemplary embodiment, the first electric magnet assembly may include a plurality of first annular coils as the one or more first annular coils.

In an exemplary embodiment, the second electric magnet assembly may include a plurality of second annular coils as the one or more second annular coils.

In an exemplary embodiment, the second magnetic field may cancel out the intensity of the first magnetic field in the center of the substrate on the substrate support.

In another exemplary embodiment, a method of processing a substrate in a chamber of a plasma processing system is provided. The method includes a) disposing a substrate on a substrate support in the chamber. A center of the substrate on the substrate support is positioned on a central axis of the chamber. The method further includes b) generating a plasma from a process gas supplied into the chamber. The method further includes c) during the operation b), generating a first magnetic field in the chamber with a first electric magnet assembly disposed on or above the chamber. The first electric magnet assembly includes one or more first annular coils. The method further includes d) during the operation c), generating a second magnetic field in the chamber with a second electric magnet assembly. The second electric magnet assembly includes one or more second annular coils, and the second magnetic field reduces intensity of the first magnetic field in the center of the substrate on the substrate support.

In an exemplary embodiment, the process gas may include hydrogen bromide and/or chlorine.

In an exemplary embodiment, the operation b) may include etching a silicon film of the substrate.

Hereinafter, various exemplary embodiments will be described in detail with reference to the drawings. In the drawing, the same or equivalent portions are denoted by the same reference symbols.

Figure 1:
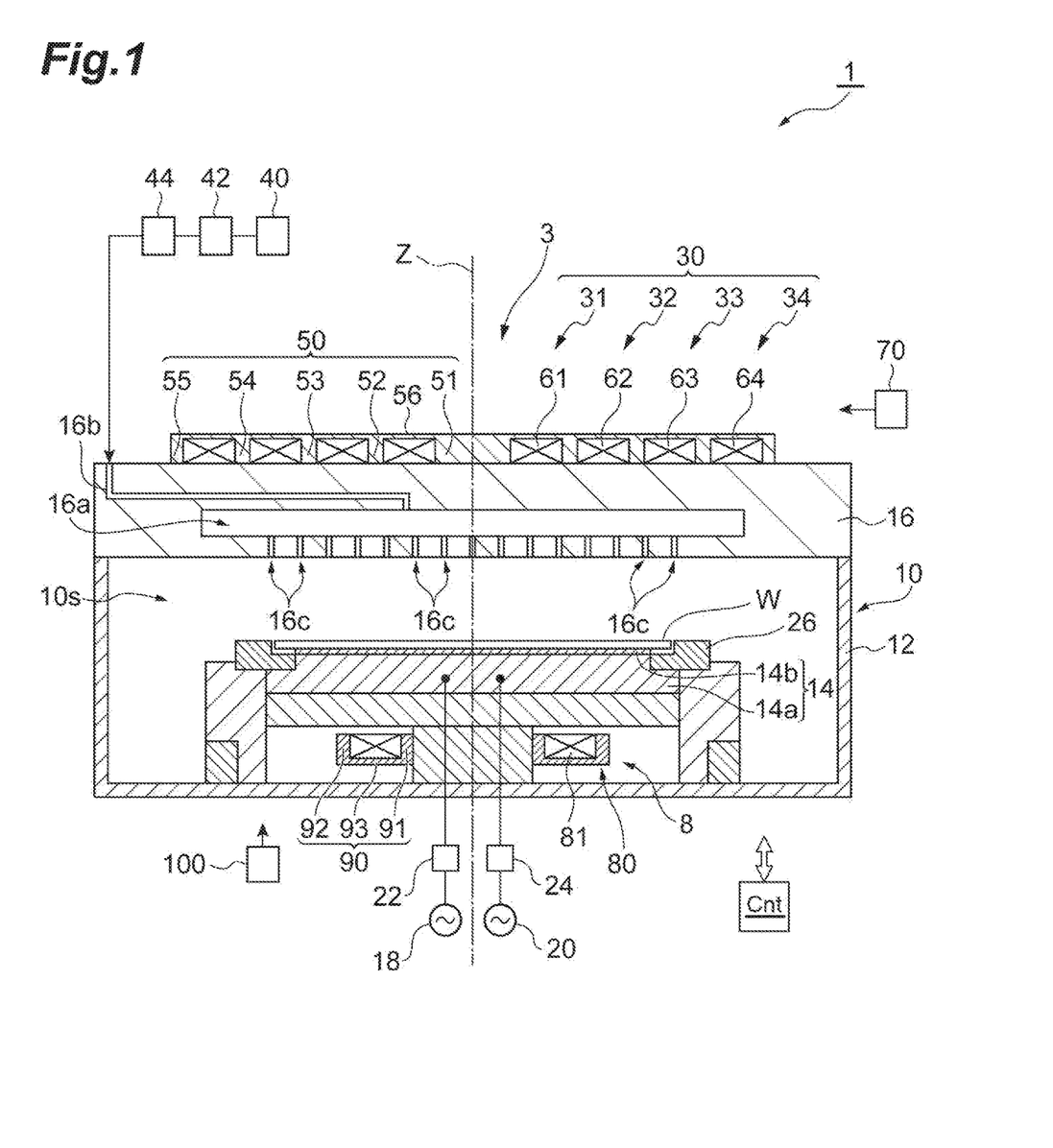
FIG. 1 is a diagram schematically showing a plasma processing system according to an exemplary embodiment.

FIG. 1 is a diagram schematically showing a plasma processing system according to an exemplary embodiment. A plasma processing system 1 shown in FIG. 1 is a capacitively coupled plasma processing system. The plasma processing system 1 includes a chamber 10. The chamber 10 provides an internal space 10s therein. The internal space 10s can be decompressed by an exhaust device.

The chamber 10 includes a chamber body 12. The chamber 10 has a central axis Z described below. The chamber body 12 is a container having a substantially cylindrical shape. The internal space 10s is provided inside the chamber body 12. The chamber body 12 is made of a conductive material such as aluminum. The inner wall surface of the chamber body 12 is covered with a film resistant to plasma. This film is, for example, an alumite film or a yttrium oxide film. The chamber body 12 is electrically grounded.

The plasma processing system 1 further includes a substrate support 14. The substrate support 14 is provided in the chamber 10. The substrate support 14 is configured to support a substrate W disposed thereon. The substrate W has, for example, a diameter of 300 mm. The substrate W is disposed on the substrate support 14 so that a center of the substrate is positioned on the central axis Z. The central axis Z is the central axis of the chamber 10 and the internal space 10s, and extends in the vertical direction. In addition, the central axis of the substrate support 14 substantially coincides with the central axis Z. That is, the center of the substrate W on the substrate support 14 is positioned on the central axis Z.

An edge ring 26 is mounted on the substrate support 14. The edge ring 26 is a substantially annular plate. The edge ring 26 is made of a material selected according to the plasma processing performed using the plasma processing system 1. The edge ring 26 is made of for example, silicon, silicon carbide, or silicon oxide. The substrate W is disposed on the substrate support 14 and in a region surrounded by the edge ring 26.

In an embodiment, the substrate support 14 includes a base 14a and an electrostatic chuck 14b. The base 14a is made of a conductive material such as aluminum. The base 14a has a substantially disk shape.

The electrostatic chuck 14b is provided on the base 14a. The electrostatic chuck 14b includes a main body and an electrode. The main body of the electrostatic chuck 14b has a substantially disk shape and is formed of a dielectric. The electrode of the electrostatic chuck 14b is a film-like electrode and is provided in the main body of the electrostatic chuck 14b. A direct-current power source is connected to the electrode of the electrostatic chuck 14b through a switch. If a direct-current voltage from the direct-current power source is applied to the electrode of the electrostatic chuck 14b, an electrostatic attraction force is generated between the electrostatic chuck 14b and the substrate W. Due to the generated electrostatic attraction force, the substrate W is attracted to the electrostatic chuck 14b and held by the electrostatic chuck 14b.

The base 14a forms a lower electrode. A first radio frequency power source 18 is electrically connected to the base 14a through a first matcher 22. The first radio frequency power source 18 generates a first radio frequency power for plasma generation. The frequency of the first radio frequency power is, for example, 100 MHz, but is not limited thereto. The first matcher 22 has a matching circuit for matching an output impedance of the first radio frequency power source 18 and an impedance on a load side (lower electrode side) of the first radio frequency power source 18 with each other. The first radio frequency power source 18 may be connected to an upper electrode 16 instead of the base 14a through the first matcher 22.

A second radio frequency power source 20 is electrically connected to the base 14a through a second matcher 24. The second radio frequency power source 20 generates a second radio frequency power. The second radio frequency power has a frequency suitable for drawing ions into the substrate W. The frequency of the second radio frequency power is lower than the frequency of the first radio frequency power. The frequency of the second radio frequency power is, for example, 3.2 MHz, but is not limited thereto. The second matcher 24 has a matching circuit for matching an output impedance of the second radio frequency power source 20 and the impedance on the load side (lower electrode side) with each other.

The plasma processing system 1 may further include the upper electrode 16. The upper electrode 16 is provided above the substrate support 14. The upper electrode 16 closes an upper opening of the chamber body 12. The upper electrode 16 also functions as a shower head. In an embodiment, the upper electrode 16 has a buffer chamber 16a, a gas line 16b, and a plurality of gas holes 16c. The plurality of gas holes 16c are connected to the buffer chamber 16a. These gas holes 16c extend downward and open toward the internal space 10s.

One end of the gas line 16b is connected to the buffer chamber 16a. A gas source group 40 is connected to the gas line 16b through a flow rate controller group 42 and a valve group 44. The gas source group 40, the flow rate controller group 42, and the valve group 44 form a gas supply unit. The gas source group 40 includes a plurality of gas sources. The flow rate controller group 42 includes a plurality of flow rate controllers. Each of the plurality of flow rate controllers are a mass flow controller or a pressure control type flow rate controller. The valve group 44 includes a plurality of valves (for example, on-off valves). The plurality of gas sources of the gas source group 40 are connected to the gas line 16b through a corresponding flow rate controller of the flow rate controller group 42 and a corresponding valve of the valve group 44.

When the plasma processing system 1 is operating, a process gas is supplied from the gas supply unit into the chamber 10. In addition, the pressure of the space in the chamber 10 is reduced by the exhaust device. In addition, first radio frequency power and/or the second radio frequency power is supplied in order to generate plasma from the process gas in the internal space 10s. In an embodiment, the first radio frequency power is supplied from the first radio frequency power source to the upper electrode or the lower electrode through the first matcher, and the second radio frequency power is supplied from the second radio frequency power source to the lower electrode through the second matcher. Therefore, the first and/or the second radio frequency power source may function as at least a part of a plasma generator configured to generate plasma from the process gas supplied into the chamber. Then, the film of the substrate W is processed by the chemical species from the plasma. The processing for the film of the substrate, that is, the plasma processing is, for example, plasma etching.

Figure 2:
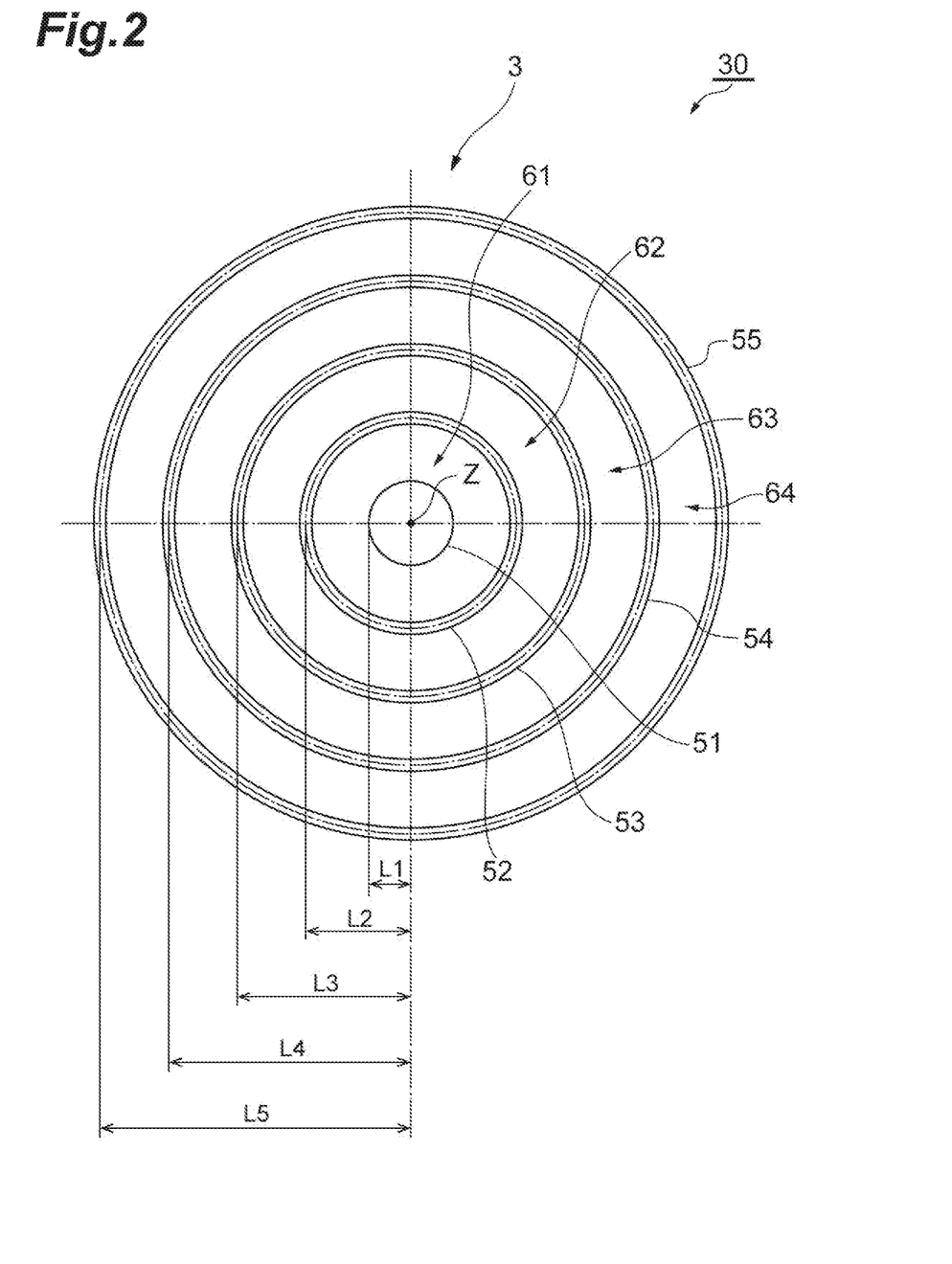
FIG. 2 is a plan view showing an example of a plurality of first electric magnets.

The plasma processing system 1 includes a first electric magnet assembly 3 including one or more first electric magnets 30. The first electric magnet assembly 3 is configured to generate a first magnetic field in the chamber 10. In an embodiment, the plasma processing system 1 includes the first electric magnet assembly 3 including a plurality of the first electric magnets 30. In the embodiment shown in FIG. 1, the plurality of first electric magnets 30 include electric magnets 31 to 34. FIG. 2 is a plan view showing an example of a plurality of first electric magnets. In FIG. 2, the plurality of first electric magnets 30 viewed from the internal space 10s side are shown. The plurality of first electric magnets 30 are provided on or above the chamber 10. That is, the first electric magnet assembly 3 is disposed on or above the chamber 10. In the example shown in FIG. 1, the plurality of first electric magnets 30 are provided on the upper electrode 16.

Each of the one or more first electric magnets 30 includes a first coil. In the example shown in FIGS. 1 and 2, the electric magnets 31 to 34 respectively include coils 61 to 64 as the first coils. The coils 61 to 64 are wound around the central axis Z. That is, the first electric magnet assembly 3 includes the first annular coils 61 to 64. The coils 61 to 64 are coaxially provided at the same height position.

The first electric magnet assembly 3 further includes a bobbin 50 (or yoke). The coils 61 to 64 are wound around the bobbin 50 (or yoke). The bobbin 50 is made of, for example, a magnetic material. The bobbin 50 has a columnar portion 51, a plurality of cylindrical portions 52 to 55, and a base portion 56. The base portion 56 has a substantially disk shape, and the central axis of the base portion coincides with the central axis Z. The columnar portion 51 and the plurality of cylindrical portions 52 to 55 extend downward from the lower surface of the base portion 56. The columnar portion 51 has a substantially columnar shape, and the central axis of the columnar portion substantially coincides with the central axis Z. A radius L1 of the columnar portion 51 is, for example, 30 mm. The cylindrical portions 52 to 55 extend outside the columnar portion 51 in the radial direction with respect to the central axis Z.

Each of the cylindrical portions 52 to 55 has a cylindrical shape extending in the vertical direction. The central axes of the cylindrical portions 52 to 55 substantially coincide with the central axis Z. That is, the cylindrical portions 52 to 55 are provided coaxially. A radius L2 of the cylindrical portion 52, a radius L3 of the cylindrical portion 53, a radius L4 of the cylindrical portion 54, and a radius L5 of the cylindrical portion 55 are larger than the radius L1 and have a relationship of L2<L3<L4<L5. For example, the radius L2, the radius L3, the radius L4, and the radius L5 are 76 mm, 127 mm, 178 mm, and 229 mm, respectively. The radius L2 is a distance between the central axis Z and the radial intermediate position between the inner peripheral surface and the outer peripheral surface of the cylindrical portion 52. The radius L3 is a distance between the central axis Z and the radial intermediate position between the inner peripheral surface and the outer peripheral surface of the cylindrical portion 53. The radius L4 is a distance between the central axis Z and the radial intermediate position between the inner peripheral surface and the outer peripheral surface of the cylindrical portion 54. The radius L5 is a distance between the central axis Z and the radial intermediate position between the inner peripheral surface and the outer peripheral surface of the cylindrical portion 55.

The coil 61 is wound along the outer peripheral surface of the columnar portion 51, and is accommodated in a groove between the columnar portion 51 and the cylindrical portion 52. The coil 62 is wound along the outer peripheral surface of the cylindrical portion 52, and is accommodated in a groove between the cylindrical portion 52 and the cylindrical portion 53. The coil 63 is wound along the outer peripheral surface of the cylindrical portion 53, and is accommodated in a groove between the cylindrical portion 53 and the cylindrical portion 54. The coil 64 is wound along the outer peripheral surface of the cylindrical portion 54, and is accommodated in a groove between the cylindrical portion 54 and the cylindrical portion 55.

A current source 70 is connected to each of the first coils of the one or more first electric magnets 30. The supply and the stop of the supply of a current from the current source 70 to each of the first coils of the one or more first electric magnets 30, the direction of the current, and the current value are controlled by a controller Cnt. In addition, when the plasma processing system 1 includes the plurality of first electric magnets 30, a single current source may be connected to the first coil of each of the plurality of first electric magnets 30, or different current sources may be individually connected thereto.

The one or more first electric magnets 30 generate a magnetic field that is axisymmetric with respect to the central axis Z in the chamber 10. By controlling the current supplied to each of the one or more first electric magnets 30, it is possible to adjust the intensity distribution (or magnetic flux density) of the magnetic field in the radial direction with respect to the central axis Z. Thereby, the plasma processing system 1 can adjust the radial distribution of the density of plasma generated in the chamber 10 to adjust the distribution of the processing speed (for example, etching rate) of the film of the substrate W in the radial direction.

The plasma processing system 1 further includes a second electric magnet assembly 8 including one or more second electric magnets 80. The second electric magnet assembly 8 is configured to generate a second magnetic field in the chamber 10. The second magnetic field reduces the intensity of the first magnetic field in the center of the substrate W on the substrate support 14. In the example shown in FIG. 1, the number of the second electric magnets 80 is one. Hereinafter, an embodiment in which the plasma processing system 1 includes one second electric magnet 80 will be described, but the number of the second electric magnets 80 included in the plasma processing system 1 may be plural.

Figure 3:
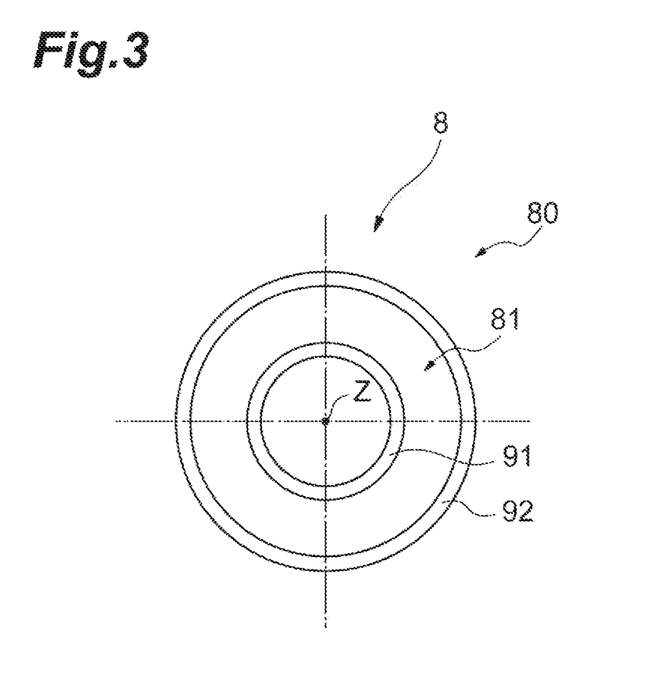
FIG. 3 is a plan view showing an example of a second electric magnet.

FIG. 3 is a plan view showing an example of a second electric magnet. In FIG. 3, the second electric magnet 80 viewed from the internal space 10s side is shown. In an embodiment, the second electric magnet 80 is provided below the substrate support 14. That is, the second electric magnet assembly 8 is disposed below the chamber 10.

The second electric magnet 80 includes a coil 81 as a second coil. The coil 81 is wound around the central axis Z. That is, the second electric magnet assembly 8 includes the second annular coil 81. When the plasma processing system 1 includes a plurality of the second electric magnets 80, the second coil of each of the plurality of second electric magnets 80 may be provided coaxially around the central axis Z at the same height position.

The second electric magnet assembly 8 further includes a bobbin 90 (or yoke). The coil 81 is wound around the bobbin 90 (or yoke). The bobbin 90 is made of, for example, a magnetic material. The bobbin 90 has a plurality of cylindrical portions 91 and 92, and a base portion 93. The base portion 93 has a substantially disk shape, and the central axis of the base portion coincides with the central axis Z. The plurality of cylindrical portions 91 and 92 extend upward from the upper surface of the base portion 93. The cylindrical portions 91 and 92 are provided coaxially around the central axis Z. The coil 81 is wound along the outer peripheral surface of the cylindrical portion 91, and is housed in a groove between the cylindrical portion 91 and the cylindrical portion 92.

A current source 100 is connected to the second coil. The supply and the stop of the supply of a current from the current source 100 to the second coil, the direction of the current, and the current value are controlled by the controller Cnt. In addition, when the plasma processing system 1 includes the plurality of second electric magnets 80, a single current source may be connected to the second coil of each of the plurality of second electric magnets 80, or different current sources may be individually connected thereto.

The second electric magnet 80 generates a magnetic field that reduces the intensity of the magnetic field generated by the one or more first electric magnets 30 at a location where the central axis Z intersects the substrate W disposed on the substrate support 14, that is, a location where the center of the substrate W is positioned. The current supplied to the second electric magnet 80 is controlled to form such a magnetic field. In an embodiment, the second electric magnet 80 generates a magnetic field that sets the intensity of the magnetic field generated by the one or more first electric magnets 30 to zero at the location.

In an embodiment, the plasma processing system 1 may further include the controller Cnt described above. The controller Cnt may be a computer device which includes a processor, a storage unit such as a memory, an input device, a display device, a signal input/output interface, and the like. The controller Cnt controls each unit of the plasma processing system 1. In the controller Cnt, an operator can perform a command input operation and the like by using the input device in order to manage the plasma processing system 1. In addition, in the controller Cnt, the operating status of the plasma processing system 1 can be visualized and displayed by the display device. Further, a control program and recipe data are stored in the storage unit. The control program is executed by the processor in order to execute various processing in the plasma processing system 1. The processor executes the control program and controls each unit of the plasma processing system 1 according to the recipe data.

The density of negative ions in the plasma generated in a chamber 10 tends to be high on or near the central axis Z. When a magnetic field is generated in the chamber 10 by the one or more first electric magnets 30 in a state where such plasma is generated, the processing speed (for example, etching rate) of the substrate W is locally increased at the center of the substrate W. In the plasma processing system 1, the intensity of the magnetic field generated by the one or more first electric magnets 30 is reduced by the magnetic field generated by the second electric magnet 80 at a location where the substrate W disposed on the substrate support 14 intersects the central axis Z. As a result, the processing speed of the substrate W is suppressed from locally increasing at the central portion thereof.

In an embodiment, the plasma processing system 1 may include the first electric magnet assembly 3 including the plurality of first electric magnets 30. In this embodiment, the radial distribution of the plasma density is adjusted by a combined magnetic field generated in the chamber 10 by the plurality of first electric magnets 30. Therefore, when the plasma processing system 1 includes the first electric magnet assembly 3 including the plurality of first electric magnets 30, the controllability of the radial distribution of the plasma density becomes high.

In an embodiment, the plasma processing system 1 may include the second electric magnet assembly 8 including the plurality of second electric magnets 80. In this embodiment, a combined magnetic field is generated in the chamber 10 with the plurality of second electric magnets 80. Therefore, the controllability of the intensity distribution of the magnetic field in the chamber 10 becomes high.

Figure 4:
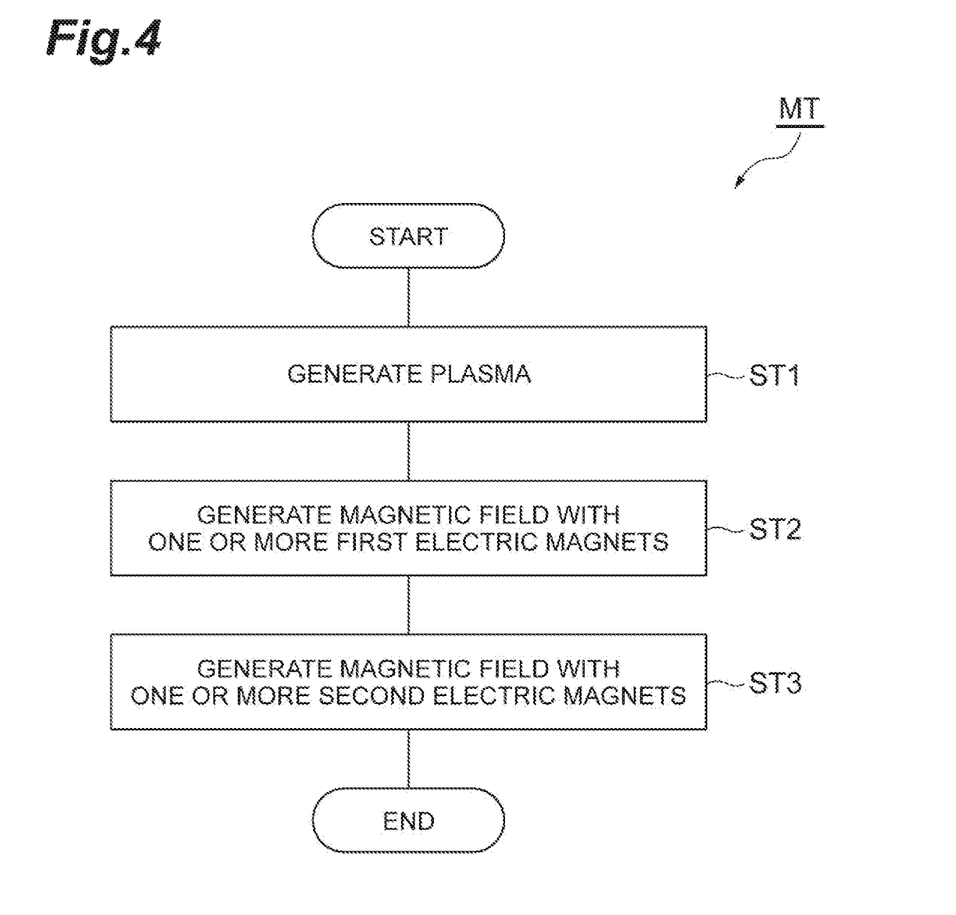
FIG. 4 is a flowchart of a method of processing a substrate according to an exemplary embodiment.

Hereinafter, a method of processing a substrate according to an exemplary embodiment will be described with reference to FIG. 4. FIG. 4 is a flowchart of a method of processing a substrate according to an exemplary embodiment. The method shown in FIG. 4 (hereinafter, referred to as "method MT") is executed using a plasma processing system. The plasma processing system used in executing the method MT includes the first electric magnet assembly 3 including one or more first electric magnets and the second electric magnet assembly 8 including one or more second electric magnets as described above. Hereinafter, the method MT will be described by taking the case where the plasma processing system 1 is used as an example.

Figure 5:
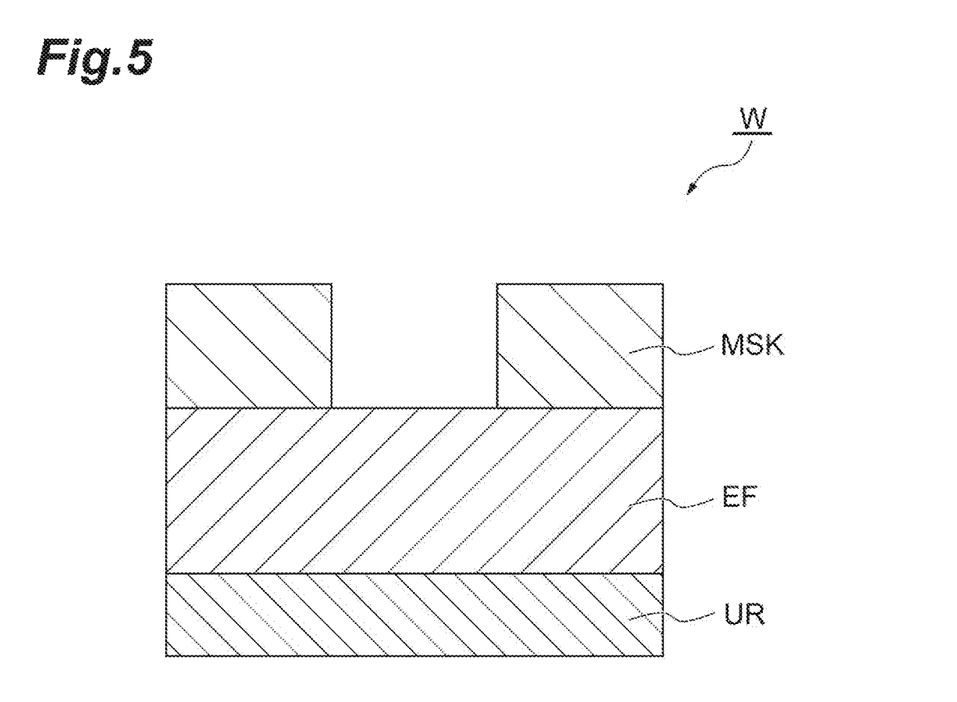
FIG. 5 is a partially enlarged sectional view of a substrate as an example.

The method MT is executed with the substrate W disposed on the substrate support 14. The substrate W is disposed on the substrate support 14 so that the center of the substrate is positioned on the central axis Z. FIG. 5 is a partially enlarged sectional view of a substrate as an example. The substrate W shown in FIG. 5 has a film EF. The film EF is a film to be subjected to plasma processing in the method MT. In an example, the film EF is a silicon film. The film EF may be a film made of another material. The substrate W may further have an underlying region UR and a mask MSK. The film EF is provided on the underlying region UR. The mask MSK is provided on the film EF. The mask MSK is patterned. In an embodiment, the method MT is applied to the substrate W to transfer the pattern of the mask MSK to the film EF.

In the method MT, step ST1 is executed with the substrate W disposed on the substrate support 14. In step ST1, plasma is generated from a process gas in the chamber 10. In step ST1, the process gas is supplied into the chamber 10. The process gas used in step ST includes one or more gases selected for plasma processing of the substrate W. In an example, the process gas may include hydrogen bromide gas and/or chlorine gas for plasma etching of the film EF, which is a silicon film. In step ST1, the pressure in the chamber 10 is set to a specified pressure. In addition, in step ST1, the first radio frequency power and/or the second radio frequency power is supplied in order to excite the process gas and generate plasma from the process gas.

In order to execute step ST1, the controller Cnt controls the gas supply unit so that the process gas is supplied into the chamber 10. In order to execute step ST1, the controller Cnt controls the exhaust device so that the pressure in the chamber 10 is set to the specified pressure. In addition, in order to execute step ST1, the controller Cnt controls the first radio frequency power source 18 and/or the second radio frequency power source 20 to supply the first radio frequency power and/or the second radio frequency power.

The method MT includes step ST2 and step ST3 in addition to step ST1. Step ST2 and step ST3 are executed during step ST1. That is, step ST2 and step ST3 are executed when plasma is generated from the process gas in the chamber 10.

In step ST2, a magnetic field is generated in the chamber 10 with the first electric magnet assembly 3 including one or more first electric magnets 30. The current supplied from the current source 70 to each of the one or more first electric magnets 30 is controlled by the controller Cnt.

In step ST3, a magnetic field is generated in the chamber 10 with the second electric magnet assembly 8 including one or more second electric magnets 80. The current supplied from the current source 100 to each of the one or more second electric magnets 80 is controlled by the controller Cnt. In step ST3, the one or more second electric magnet 80 generate a magnetic field that reduces the intensity of the magnetic field generated by the one or more first electric magnets 30 at a location where the central axis Z intersects the substrate W disposed on the substrate support 14, that is, a location where the center of the substrate W is positioned. In an embodiment, the one or more second electric magnets 80 generate a magnetic field that sets the intensity of the magnetic field generated by the one or more first electric magnets 30 to zero at a location where the central axis Z intersects the substrate W disposed on the substrate support 14.

In the method MT, the substrate W is processed by the chemical species from the plasma in the chamber 10 in a state where the magnetic field is generated in the chamber 10 by the one or more first electric magnets and the one or more second electric magnets. In the method MT as an example, the film EF, which is a silicon film of the substrate W, is etched by the ions from the plasma generated from the process gas including the hydrogen bromide gas and/or the chlorine gas.

In the method MT, the intensity of the magnetic field generated by the one or more first electric magnets 30 is reduced by the magnetic field generated by the second electric magnet 80 at a location where the substrate W intersects the central axis Z. Therefore, according to the method MT, the processing speed of the substrate W is suppressed from locally increasing at the central portion thereof. In an example in which the film EF, which is a silicon film, is etched by the ions from the plasma generated from the process gas including the hydrogen bromide gas and/or the chlorine gas, the etching rate of the film EF is suppressed from locally increasing at the center thereof.

While various exemplary embodiments have been described above, various additions, omissions, substitutions and changes may be made without being limited to the exemplary embodiments described above. Elements of the different embodiments may be combined to form another embodiment.

For example, the second electric magnet assembly 8 including one or more second electric magnets may be provided on or above the chamber 10. In an embodiment, one or more electric magnets of the electric magnets 31 to 34 may be used as the first electric magnet, and one or more other electric magnets of the electric magnets 31 to 34 may be used as the second electric magnet. That is, a first group including one or more annular coils of the annular coils 61 to 64 is included in the first electric magnet assembly 3 and a second group including one or more other annular coils of the annular coils 61 to 64 may be included in the second electric magnet assembly 8. In this case, the second electric magnet assembly 8 is disposed at the same height as the first electric magnet assembly 3. Also in this case, the current supplied to the first coil of each first electric magnet and the second coil of each second electric magnet is controlled so that the magnetic field that reduces the intensity of the magnetic field generated by the one or more first electric magnets at the above-mentioned location is generated by the one or more second electric magnets. For example, a current in a direction opposite to the direction of the current supplied to each first electric magnet is supplied to the coil of each second electric magnet. In an embodiment, the second electric magnet assembly 8 may be disposed on or above the chamber 10 at a height different from the height of the first electric magnet assembly 3. For example, the second electric magnet assembly 8 may be disposed on or above the first electric magnet assembly 3 and may be disposed between the chamber 10 and the first electric magnet assembly 3.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing system comprising:
   a chamber having a central axis;
   a substrate support disposed in the chamber, the substrate support being configured to support a center of a substrate on the central axis;
   a plasma generator configured to generate a plasma from a process gas supplied into the chamber;
   a first electric magnet assembly disposed on or above the chamber, the first electric magnet assembly including a first annular coil, a second annular coil surrounding the first annular coil, a third annular coil surrounding the second annular coil and a fourth annular coil surrounding the third annular coil;
   a second electric magnet assembly disposed below the substrate support, the second electric magnet assembly including a fifth annular coil vertically overlapping with the first annular coil without any annular coil vertically overlapping with the third to fourth annular coils;
   at least one first current source;
   a second current source; and
   a controller programmed to control processing performed by the plasma processing system by
   controlling the at least one first current source configured to supply first to fourth currents to the respective first to fourth annular coils so as to generate a first magnetic field in the chamber, the first magnetic field having a first intensity in a center region of the substrate support and a second intensity in a peripheral region of the substrate support, the first intensity being greater than the second intensity; and
   controlling the second current source configured to supply a fifth current to the fifth annular coil so as to generate a second magnetic field reducing the first intensity of the first magnetic field in the center region of the substrate support to suppress a processing speed from locally increasing at the center region of the substrate support.

2. The plasma processing system of claim 1, wherein the fifth annular coil further vertically overlaps with the second annular coil.

3. The plasma processing system of claim 1, wherein the second magnetic field cancels out the intensity of the first magnetic field in the center of the substrate support.

4. A plasma processing system comprising:
a chamber;
a substrate support disposed in the chamber;
a plasma generator configured to generate a plasma in the chamber;
a first electric magnet assembly disposed on or above the chamber, the first electric magnet assembly including a plurality of first annular coils;
a second electric magnet assembly disposed below the substrate support, the second electric magnet assembly including a single second annular coil vertically overlapping with an innermost first annular coil of the plurality of first annular coils;
at least one first current source;
a second current source; and
a controller programmed to control processing performed by the plasma processing system by
controlling the at least one first current source configured to supply a first current to each of the plurality of first annular coils so as to generate a first magnetic field in the chamber, the first magnetic field having a first intensity in a center region of the substrate support and a second intensity in a peripheral region of the substrate support, the first intensity being greater than the second intensity; and
controlling the second current source configured to supply a second current to the single second annular coil so as to generate a second magnetic field reducing the first intensity of the first magnetic field in the center region of the substrate support to suppress a processing speed from locally increasing at the center region of the substrate support.

5. A plasma processing system comprising:
a chamber;
a substrate support disposed in the chamber;
a plasma generator configured to generate a plasma in the chamber;
an electric magnet assembly disposed on or above the chamber, the electric magnet assembly including one or more first annular coils and one or more second annular coils;
one or more first current sources;
one or more second current sources; and
a controller programmed to control processing performed by the plasma processing system by
controlling the one or more first current sources configured to supply a first current to the one or more first annular coils so as to generate a first magnetic field in the chamber, the first current having a first direction;
controlling the one or more second current source configured to supply a second current to the one or more second annular coil so as to generate a second magnetic field reducing intensity of the first magnetic field in a first region vertically overlapping with the one or more second annular coils, the second current having a second direction opposite to the first direction.

* * * * *